(12) United States Patent
Eun et al.

(10) Patent No.: US 7,537,995 B2
(45) Date of Patent: May 26, 2009

(54) METHOD FOR FABRICATING A DUAL POLY GATE IN SEMICONDUCTOR DEVICE

(75) Inventors: Byung Soo Eun, Seoul (KR); Hyun Seok Kang, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 34 days.

(21) Appl. No.: 11/760,340

(22) Filed: Jun. 8, 2007

(65) Prior Publication Data

US 2008/0160745 A1 Jul. 3, 2008

(30) Foreign Application Priority Data

Dec. 29, 2006 (KR) .................. 10-2006-0138843

(51) Int. Cl.
H01L 21/336 (2006.01)
(52) U.S. Cl. .................. 438/259; 438/270; 438/271; 438/593; 257/330; 257/331; 257/E21.637; 257/E21.623
(58) Field of Classification Search ......... 438/259–257, 438/274–270, 157, 176, 377, 546; 257/E21.623, 257/E21.637
See application file for complete search history.

(56) References Cited

U.S. PATENT DOCUMENTS 6,489,210 B1 * 12/2002 Sohn et al. .................. 438/306
6,653,699 B1 * 11/2003 Yang ........................... 257/412

2007/0029623 A1 2/2007 Liu et al.
2007/0099381 A1 5/2007 Walker

FOREIGN PATENT DOCUMENTS

KR 1020060010465 2/2006
KR 1020060038751 5/2006

* cited by examiner

Primary Examiner—Dung A. Le
(74) Attorney, Agent, or Firm—Marshall, Gerstein & Borun LLP

(57) ABSTRACT

A method for fabricating a dual poly gate in a semiconductor device is disclosed. The method comprises forming a gate insulating layer over a semiconductor substrate including a first region and a second region, forming a first conductive type polysilicon layer and a second conductive type polysilicon layer in the first and second regions, respectively, depositing a gate metal layer and a hard mask layer over the first conductive type and second conductive type polysilicon layers, patterning the hard mask layer to form a hard mask pattern, etching the gate metal layer using the hard mask pattern as an etching mask until the surfaces of the first conductive type and second conductive type polysilicon layers are exposed, implanting inert ions into the first conductive type and second conductive type polysilicon layers using the hard mask pattern for ion implantation to form an amorphous silicon film, and etching the amorphous silicon films and the gate insulating layer using the hard mask pattern as an etching mask to form a gate stack.

5 Claims, 4 Drawing Sheets

METHOD FOR FABRICATING A DUAL POLY GATE IN SEMICONDUCTOR DEVICE

CROSS-REFERENCE TO RELATED APPLICATION

Priority to Korean patent application number 10-2006-138843, filed on Dec. 29, 2006, the disclosure of which is incorporated by reference in its entirety, is claimed.

BACKGROUND OF THE INVENTION

The invention relates to a semiconductor device. More specifically, the invention relates to a method for fabricating a dual poly gate in a semiconductor device having an improved gate profile.

Semiconductor devices, e.g., dynamic random access memories (DRAMs) include a cell region and a peripheral circuit region. In particular, complementary metal oxide semiconductor (CMOS) devices are arranged in the peripheral circuit region. A p-channel-type MOS (PMOS) transistor in general CMOS devices has a buried channel structure. The buried channel structure involves a reduction in channel length in more highly integrated semiconductor devices, thus causing an increase in leakage current when applying a high electrical field to the structure. Accordingly, a dual poly gate structure has been used to form a PMOS transistor having a surface channel structure. The dual poly gate structure has a p-type poly gate doped with p-type impurities arranged in a PMOS region, and an n-type poly gate doped with n-type impurities arranged in an NMOS region.

FIG. 1 is an SEM (scanning electron micrograph) illustrating conventional bridge defects.

Referring to FIG. 1, heat treatment activates impurities doped into a gate conductive layer when forming a dual poly gate. During the heat treatment, the gate conductive layer undergoes crystallization. For this reason, etching through the crystalline poly gate layer used to form a poly gate on a semiconductor substrate involves a significantly lower etching rate, as compared to an amorphous poly gate layer. As a result, there is an undesired variation in gate profiles, for example an unexpected increase in the width of the gate conductive layer. The variation in gate profile may cause "bridge" defects 100 where the gate conductive layer is in contact with a landing plug formed between gate stacks (see FIG. 1), thus resulting in the deterioration of device characteristics.

BRIEF SUMMARY OF THE INVENTION

In an attempt to solve the aforementioned problems, one aspect of the invention provides a method for fabricating a dual poly gate in a semiconductor device capable of preventing bridge defects via an improvement in a gate profile.

In accordance with one aspect of the invention, there is provided a method for fabricating a dual poly gate in a semiconductor device comprising: forming a gate insulating layer over a semiconductor substrate including a first region and a second region; forming a first conductive type polysilicon layer in the first region and a second conductive type polysilicon layer in the second region; depositing a gate metal layer and a hard mask layer over the first conductive type and second conductive type polysilicon layers; patterning the hard mask layer to form a hard mask pattern; etching the gate metal layer using the hard mask pattern as an etching mask until the surfaces of the first conductive type and second conductive type polysilicon layers are exposed to; implanting inert ions into the first conductive type and second conductive type polysilicon layers using the hard mask pattern for ion implantation to form an amorphous silicon film; and etching the amorphous silicon film and the gate insulating layer using the hard mask pattern as an etching mask to form a gate stack.

The step of forming a first conductive type polysilicon layer and a second conductive type polysilicon layer may include: forming a polysilicon layer doped with first conductive type impurity ions on the gate insulating layer; forming a mask pattern over the polysilicon layer such that the polysilicon film in the first region is exposed through the mask pattern; implanting second conductive type impurity ions into the polysilicon layer in the first region using the mask pattern for ion implantation; and heat treating the semiconductor substrate.

The hard mask pattern preferably has a thickness of 2,600 Å to 3,200 Å

The inert ions preferably include argon (Ar) and nitrogen ($N_2$). The inert ions are preferably implanted at a dose of about 2E15 atoms/cm$^2$ to about 5E15 atoms/cm$^2$ and a tilt angle of 0° with an energy of about 25 keV to 50 keV.

BRIEF DESCRIPTION OF THE DRAWINGS

The above and other aspects, features, and advantages of the invention will be more clearly understood from the following detailed description taken in conjunction with the accompanying drawings, in which.

DETAILED DESCRIPTION OF THE INVENTION

Figure 1:
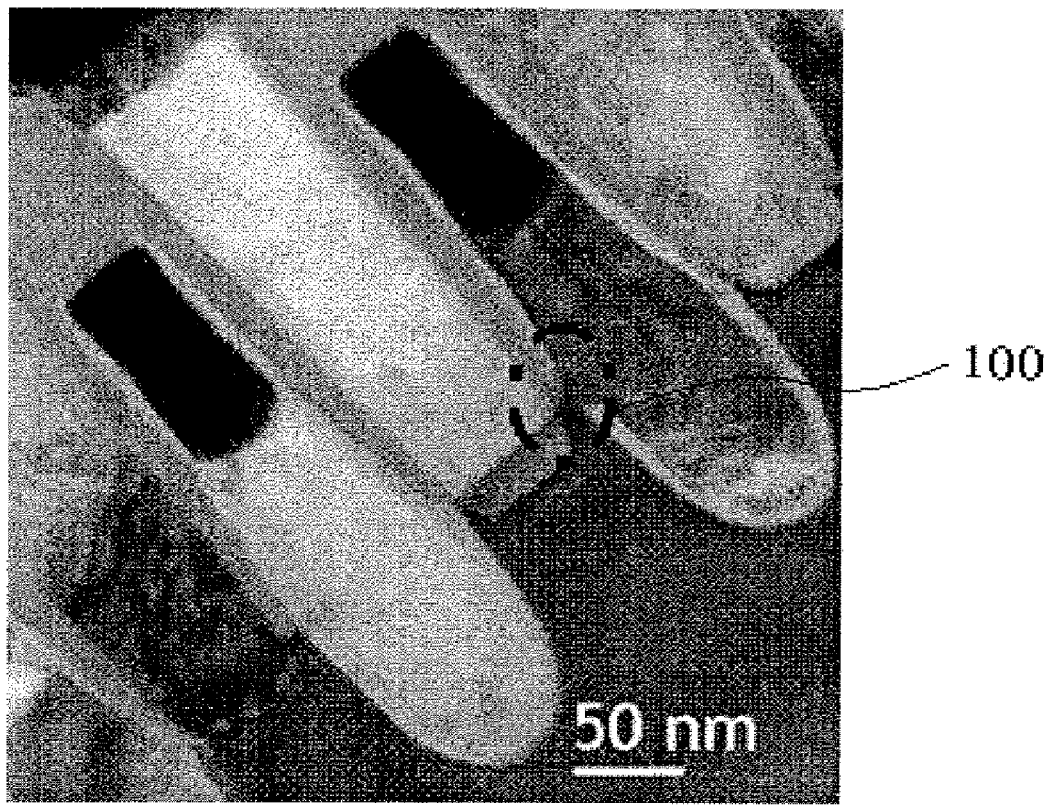
FIG. 1 is an SEM (scanning electron micrograph) illustrating a conventional bridge phenomenon.

Exemplary embodiments of the invention are described in detail with reference to the accompanying drawings. In the drawings, the thickness of each element is enlarged for clarity Throughout the disclosure, the same or similar elements are denoted by the same reference numerals.

FIGS. 2A to 2G are cross-sectional views illustrating a method for fabricating a dual poly gate in a semiconductor device.

Figure 2A:
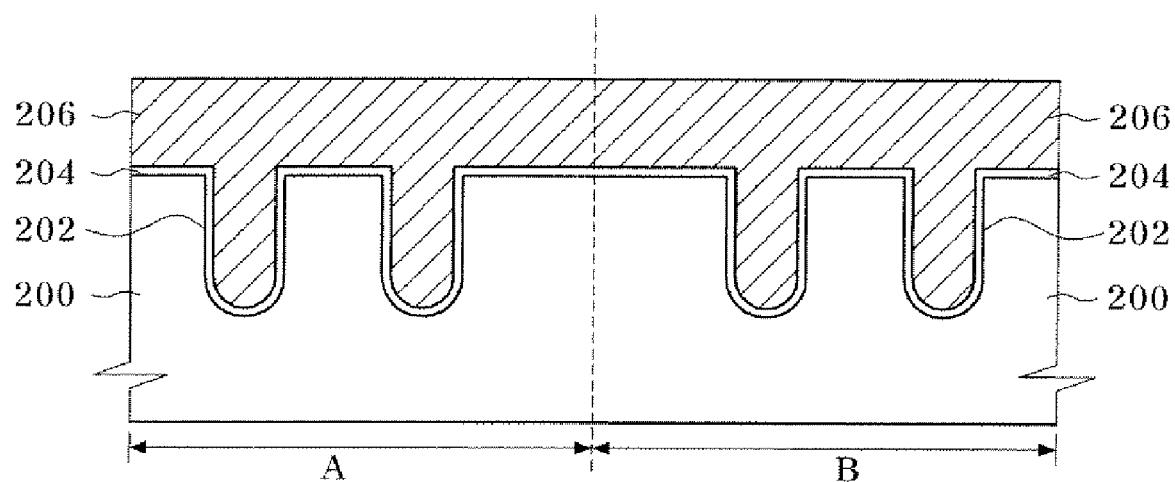
FIGS. 2A to 2G are cross-sectional views illustrating a method for fabricating a dual poly gate in a semiconductor device according to one embodiment of the invention.

Referring to FIG. 2A, a trench 202 is formed on a semiconductor substrate 200 including a first region A and a second region B. Then, a gate insulating layer 204 and an amorphous film 206 are formed on the semiconductor substrate 200.

More specifically, a photoresist film (not shown) is applied to the surface of the semiconductor substrate 200, followed by patterning, to form a photoresist film pattern (not shown) through which the semiconductor substrate 200 is partially exposed. The resulting structure is etched using the photoresist film pattern as an etching mask to form the trench 202 having a predetermined depth inside the semiconductor substrate 200. The gate insulating layer 204 and the amorphous film 206 are formed on the resulting structure including the trench 202. A p-channel-type MOS transistor is located in the first region A. An n-channel-type MOS transistor is located in the second region B. The gate insulating layer 204 is formed as an oxide film. The amorphous film 206 may contain no impurity ions or may be doped with impurity ions such as phosphorus (P) ions.

Figure 2B:
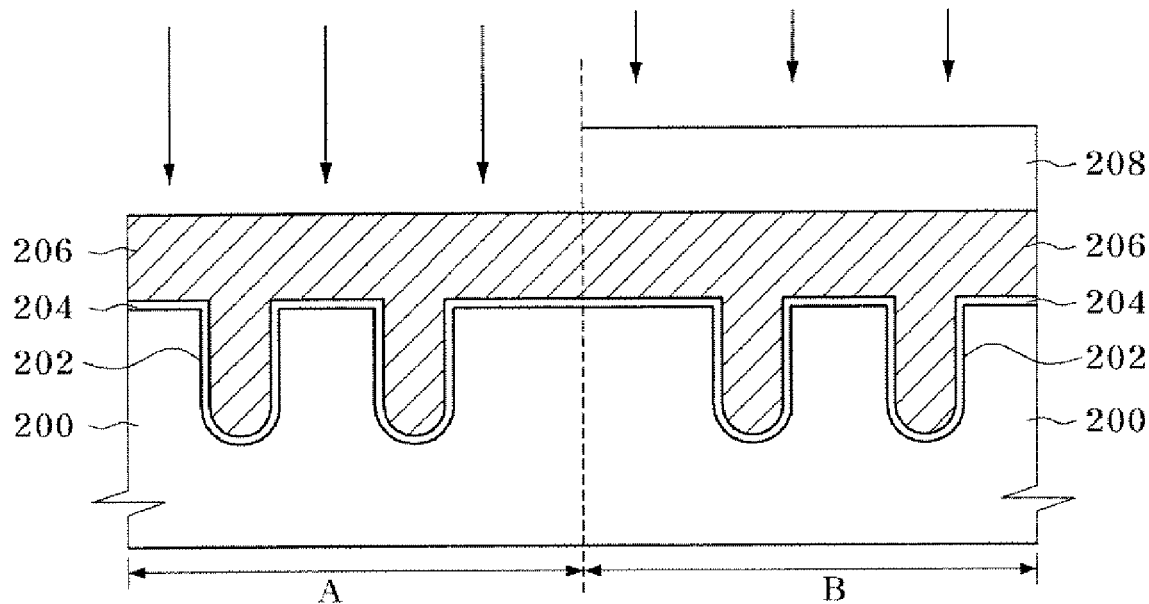

Referring to FIG. 2B, a mask pattern 208, through which the first region A is exposed, is formed on the resulting structure. The mask pattern 208 is made of a photoresist material.

As indicated by the arrows shown in FIG. 2B, ion implantation is performed using the mask film pattern 208 as a mask to implant p-type impurity ions such as boron (B) or boron trifluoride ($BF_3$) ions into of the amorphous silicon film 206 in the first region A. As a result, the portion of the amorphous silicon film 206 in the first region A is doped with p-type impurity ions and the portion of the amorphous silicon film in the second region B is doped with n-type impurity ions. After the ion implantation, the mask film pattern 208 is removed.

The resulting structure is heat treated to activate the impurity ions implanted into the amorphous silicon film 206. During heat treatment, a p-type polysilicon layer 210 and an n-type polysilicon layer 211 are formed in the first region A and the second region B, respectively. The heat treatment may be carried out by rapid thermal annealing (RTA).

During rapid thermal annealing, the amorphous silicon film 206 undergoes crystallization, i.e., an amorphous-to-crystalline phase transition. Upon crystallization, grain boundaries are caused by impurities. Etching through the crystallized polysilicon film used to form a gate stack in a subsequent process involves a significantly lower etching rate, as compared to the amorphous polysilicon film 206. As a result, there is an undesired variation in gate profiles, for example an unexpected increase in the width of the polysilicon layer. The variation in gate profile may cause the bridge phenomenon 100 in which the polysilicon layer is in contact with a landing plug adjacent to a gate stack upon forming the landing plug in a subsequent process (see FIG. 1), thus resulting in the deterioration of device characteristics. Accordingly, there is a need for method that is capable of preventing the bridge.

Figure 2C:
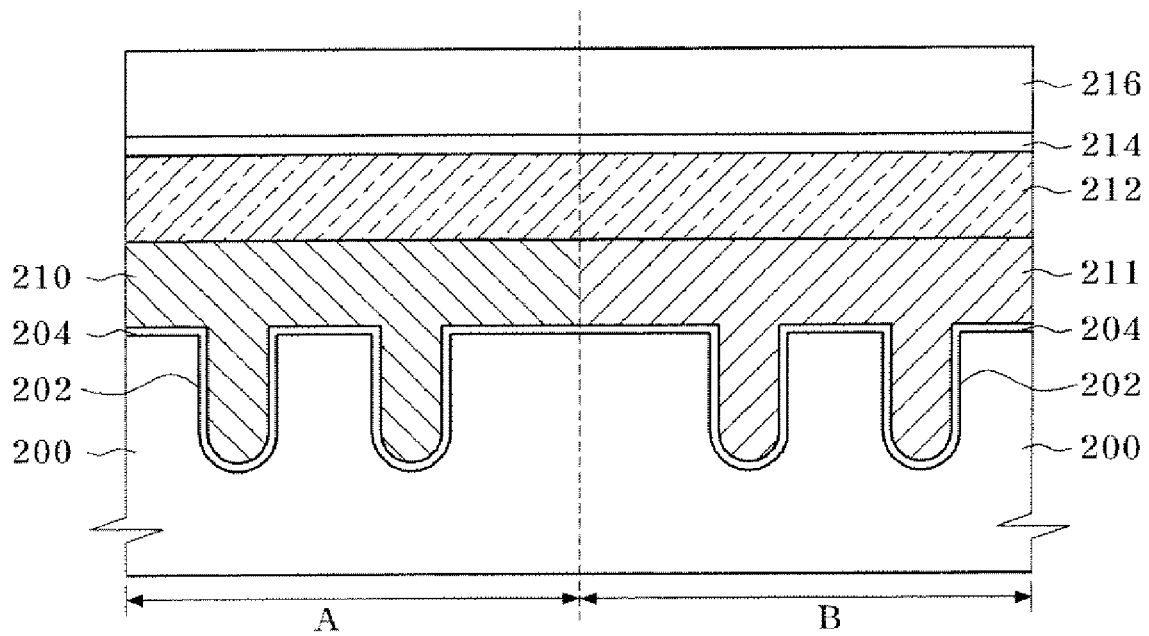

Referring to FIG. 2C, a gate metal film 212, a buffer oxide film 214, and a hard mask film 216 are sequentially formed on the p-type polysilicon layer 210 and the n-type polysilicon layer 211. The gate metal layer 212 may be selected from a metal silicide layer, a metal layer, and combinations thereof. The metal silicide layer may be made of tungsten silicide ($WSi_x$). The metal layer may be made of tungsten (W). The buffer oxide layer 214 is arranged between the gate metal layer 212 and the hard mask layer 216. The buffer oxide layer 214 prevents the hard mask layer 216 from being lifted in a subsequent process. The deposited hard mask layer 216 is formed from a nitride film. The hard mask layer 216 has a relatively large thickness of 2,600 Å to 3,200 Å, which is the same as 100 Å to 200 Å is added to the thickness of conventional films, i.e., 2,600 Å. The large thickness prevents excessive loss of and damage to the hard mask layer 216 during a subsequent ion implantation.

Figure 2D:
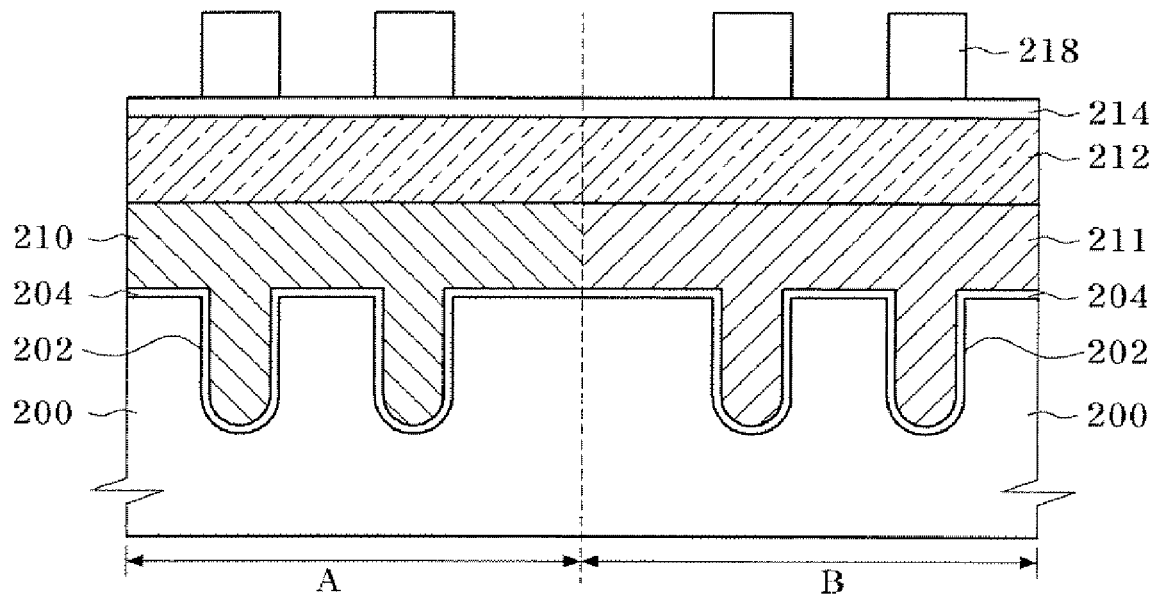

Referring to FIGS. 2C and 2D, the hard mask layer 216 is patterned to form a hard mask pattern 218.

More specifically, a photoresist material (not shown) is applied to the surface of the hard mask layer 216, followed by patterning, to form a photoresist film pattern (not shown) through which the hard mask layer 216 is partially exposed. The portions blocked by the photoresist film pattern are where gate stacks are formed after subsequent etching. The hard mask layer 216 is etched using the photoresist film pattern as an etching mask to form a hard mask pattern 218. Then, the photoresist film pattern is removed by stripping.

Figure 2E:
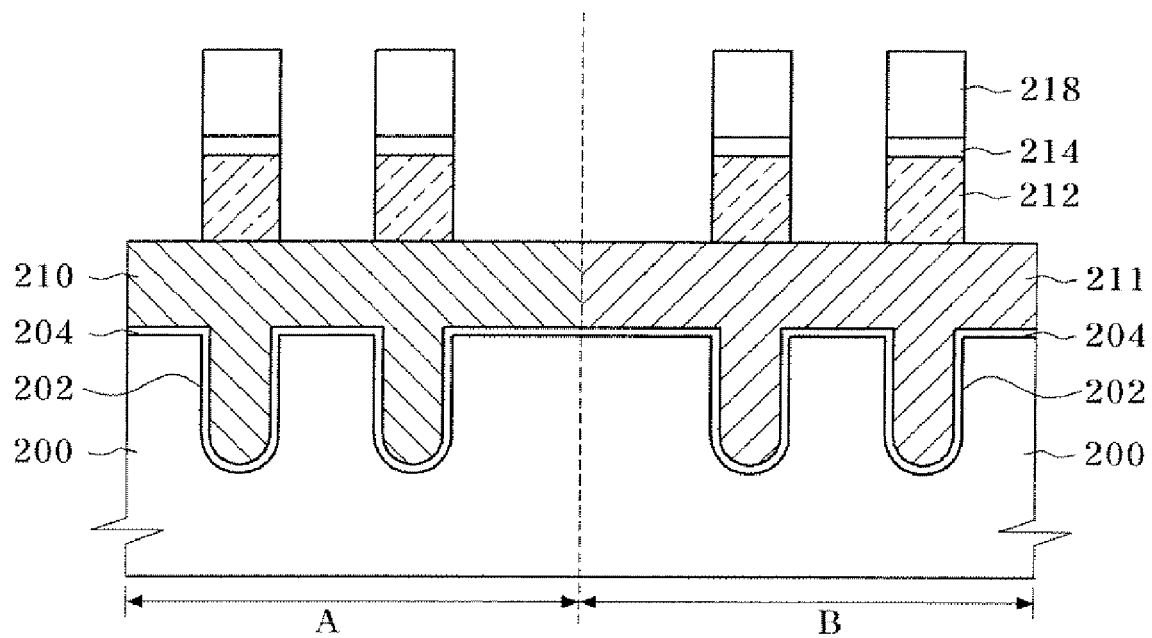

Referring to FIG. 2E, the resulting structure is etched using the hard mask pattern 218 as an etching mask until the surfaces of the p-type polysilicon layer 210 and the n-type polysilicon layer 211 are exposed. As a result, the buffer oxide layer 214 and the gate metal layer 212 are etched to form a buffer oxide layer pattern 220 and a gate metal layer pattern 222.

Figure 2F:
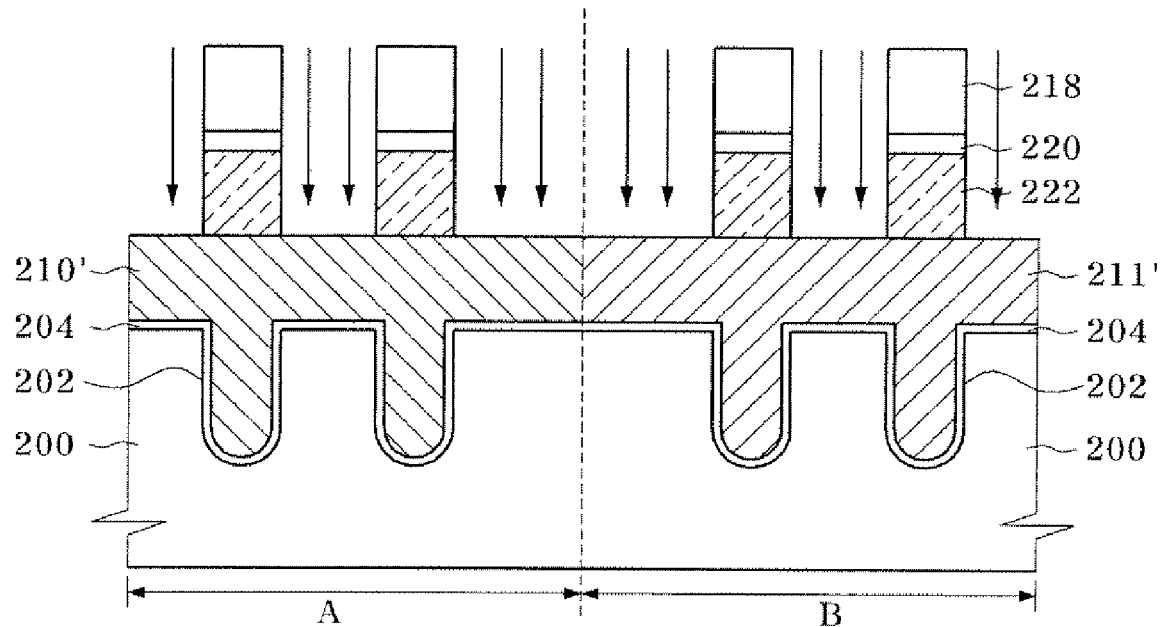

Referring to FIG. 2F, impurity ions are implanted into the p-type polysilicon layer 210 and the n-type polysilicon layer 211 exposed through the film patterns 218, 220, and 222 to form a p-type amorphous film 210' and an n-type amorphous film 211'.

As indicated by the arrows shown in FIG. 2F, ion implantation is performed using the hard mask pattern 218 for ion implantation to implant inert ions into the p-type polysilicon film 210 and the n-type polysilicon film 211. The inert ions include argon (Ar) and nitrogen ($N_2$) ions. The implantation of the inert ions is carried out by implanting the inert ions at a dose of about 2E15 atoms/cm$^2$ to about 2E15 atoms/cm$^2$ and a tilt angle of 0° with an energy of about 25 keV to 50 keV. During the ion implantation, the p-type polysilicon film 210 and the n-type polysilicon film 211 undergo a crystalline-to-amorphous phase transition, thus being converted into a p-type amorphous silicon film 210' and an n-type amorphous silicon film 211'.

The conversion of the crystalline polysilicon films 210 and 211 into the amorphous silicon films 210' and 211' via the implantation of inert ions involves no undesired variation in gate profiles during the subsequent etching used to form a gate stack. Accordingly, there is no increase in the width of the gate conductive layer. For this reason, bridge defects such as the gate conductive layer being in contact with a landing plug arranged between gate stacks can be inhibited.

Figure 2G:
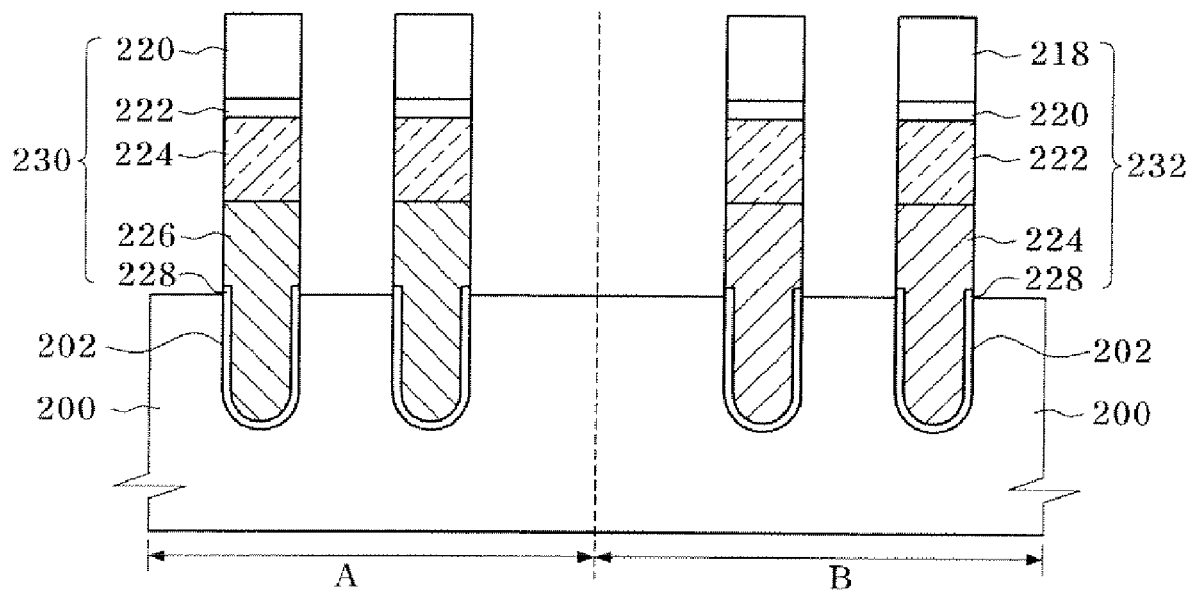

Referring to FIG. 2G, the p-type amorphous silicon film 210', the n-type amorphous silicon film 211' and the gate insulating layer 204 are etched using the hard mask pattern 218 as an etching mask to form a gate conductive patterns 224 and 226, and a gate insulating pattern 228.

More specifically, the semiconductor substrate 200 is loaded into an etching system. First and second etching steps are performed by introducing an etching gas into the etching system.

The first etching step is carried out by introducing nitrogen ($N_2$), oxygen ($O_2$), and hydrogen bromide (HBr) while applying a desired power to the system. More specifically, the first etching is carried out by introducing nitrogen ($N_2$), oxygen ($O_2$) and hydrogen bromide (HBr) at flow rates of 5 sccm, 7 sccm, and 280 sccm, respectively, while maintaining the internal pressure of the etching system within a range of 15 mTorr to 20 mTorr. At this time, a side power and a bottom power applied to the system are 400 W and 130 W, respectively.

The second etching step is carried out by introducing helium (He), oxygen ($O_2$) and hydrogen bromide (HBr) while applying a desired power to the system. More specifically, the second etching step is carried out by introducing helium (He), oxygen ($O_2$), and hydrogen bromide (HBr) at flow rates of 80 sccm, 5 sccm, and 300 sccm, respectively, while maintaining the internal pressure of the etching system within a range of 60 mTorr to 70 mTorr. At this timer a side power and a bottom power applied to the system are 250 W and 130 W, respectively.

As mentioned above, the hard mask pattern 218 serves as a mask for ion implantation during the implantation of inert ions into the polysilicon films 210' and 211', thus suffering damage after the ion implantation. Thus, the hard mask pattern 218 is etched at a high rate, and experiences a significant degree of loss. The excessive loss of the hard mask pattern 218 can be prevented by depositing the hard mask pattern 218 to a larger thickness (e.g., 2,600 Å to 3,200 Å) relative to conventional cases.

After the etching, a p-type poly gate stack 230 and an n-type poly gate stack 232 are formed in the first region A and in the second region B of the semiconductor substrate 200, respectively.

According to the method for fabricating a dual poly gate in a semiconductor device of the invention, the crystalline polysilicon film is converted into an amorphous silicon film via the implantation of inert ions into the crystalline polysilicon film. As a result, the problem of variation in the gate profile caused by the crystalline polysilicon film can be prevented. Thus, bridge defects (i.e., where the gate conductive film is in contact with a landing plug to be formed in a subsequent process), can be inhibited.

As apparent from the foregoing, the method for fabricating a dual poly gate in a semiconductor device according to the invention prevents an undesired increase in the film width resulting from the crystalline polysilicon film. Therefore, bridge defects can be inhibited.

Although preferred embodiments of the invention have been disclosed for illustrative purposes, those skilled in the art will appreciate that various modifications, additions and substitutions are possible, without departing from the scope and spirit of the invention as defined by in the accompanying claims

What is claimed is:

1. A method for fabricating a dual poly gate in a semiconductor device comprising:

forming a gate insulating layer over a semiconductor substrate including a first region and a second region;

forming a first conductive type polysilicon layer in the first region and a second conductive type polysilicon layer in the second region;

depositing a gate metal layer and a hard mask layer over the first conductive type and second conductive type polysilicon layers;

patterning the hard mask layer to form a hard mask pattern;

etching the gate metal layer using the hard mask pattern as an etching mask until the surfaces of the first conductive type and second conductive type polysilicon layers are exposed;

implanting inert ions into the first conductive type and second conductive type polysilicon layers using the hard mask pattern as a mask for ion implantation to form an amorphous silicon film; and etching the amorphous silicon film and the gate insulating layer using the hard mask pattern as an etching mask to form a gate stack.

2. The method according to claim 1, wherein the step of forming a first conductive type polysilicon layer and a second conductive type polysilicon layer comprises:

forming a poly silicon layer doped with first conductive type impurity ions on the gate insulating layer;

forming a mask pattern on the poly silicon layer such that the poly silicon layer in the first region is exposed through the mask pattern;

implanting second conductive type impurity ions into the poly silicon layer in the first region using the mask pattern for ion implantation; and heat treating the semiconductor substrate.

3. The method according to claim 1, wherein the hard mask pattern has a thickness of 2,600 Å to 3,200 Å.

4. The method according to claim 1, wherein the inert ions comprise argon (Ar) and nitrogen ($N_2$).

5. The method according to claim 1, comprising implanting the inert ions at a dose of about 2E15 atoms/$cm^2$ to about 5E15 atoms/$cm^2$ and a tilt angle of 0° with an energy of about 25 keV to 50 keV.

* * * * *